(12) United States Patent
Noguchi et al.

(10) Patent No.: US 7,402,465 B2
(45) Date of Patent: Jul. 22, 2008

(54) METHOD OF FABRICATING SINGLE-CRYSTAL SILICON FILM AND METHOD OF FABRICATING TFT ADOPTING THE SAME

(75) Inventors: Takashi Noguchi, Seongnam-si (KR); Wenxu Xianyu, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 450 days.

(21) Appl. No.: 11/270,607

(22) Filed: Nov. 10, 2005

(65) Prior Publication Data
US 2006/0099777 A1    May 11, 2006

Related U.S. Application Data

(60) Provisional application No. 60/657,736, filed on Mar. 3, 2005.

(30) Foreign Application Priority Data
Nov. 11, 2004    (KR) ...................... 10-2004-0091851

(51) Int. Cl.
*H01L 21/00* (2006.01)

(52) U.S. Cl. .................. 438/149; 438/164; 438/458; 438/459; 438/479; 257/E51.505

(58) Field of Classification Search .................. 438/149, 438/458, 459, 455, 479, 480
See application file for complete search history.

(56) References Cited

U.S. PATENT DOCUMENTS

| | | | | |
|---|---|---|---|---|
| 4,509,990 A | * | 4/1985 | Vasudev | 438/155 |
| 5,374,564 A | * | 12/1994 | Bruel | 438/455 |
| 6,528,387 B1 | * | 3/2003 | Moriyasu et al. | 438/404 |
| 6,768,175 B1 | * | 7/2004 | Morishita et al. | 257/352 |
| 2002/0151120 A1 | * | 10/2002 | Yamazaki et al. | 438/166 |

* cited by examiner

*Primary Examiner*—Michael Trinh
(74) *Attorney, Agent, or Firm*—Buchanan Ingersoll & Rooney PC (57) ABSTRACT

A method for forming a single-crystal silicon film of high quality is provided. The method includes the operations of: growing single-crystal silicon to a predetermined thickness of a crystal growth plate; depositing a buffer layer on the single-crystal silicon layer; forming a partition layer at a predetermined depth in the single-crystal silicon layer by implanting hydrogen ions in the single-crystal silicon layer from an upper portion of an insulating layer; attaching a substrate onto the buffer layer; and cutting the partition layer of the single-crystal silicon layer by heating the partition layer from the crystal growth plate to obtain a single-crystal silicon layer of a predetermined thickness on the substrate.

8 Claims, 8 Drawing Sheets

METHOD OF FABRICATING SINGLE-CRYSTAL SILICON FILM AND METHOD OF FABRICATING TFT ADOPTING THE SAME

CROSS-REFERENCE TO RELATED PATENT APPLICATIONS

This application claims the benefits of Korean Patent Application No. 10-2004-0091851, filed on Nov. 11, 2004, in the Korean Intellectual Property Office, and U.S. patent application Ser. No. 60/657,736, filed on Mar. 3, 2005, the disclosure of which is incorporated herein in its entirety by reference.

BACKGROUND OF THE DISCLOSURE

1. Field of the Disclosure

The present disclosure relates to a method of fabricating a single-crystal silicon film and a method of fabricating a thin film transistor (TFT) adopting the same.

2. Description of the Related Art

Poly crystalline silicon (poly-Si) has higher carrier mobility than that of amorphous Si (a-Si), and thus, is utilized in a flat panel display device and in various electronic devices such as solar batteries. However, the carrier mobility and homogeneity of poly-Si are inferior to those of single-crystal Si.

Single-crystal Si is useful for a system on panel (SOP) structure, in which a system is formed on a display panel. The mobility of single-crystal Si is 300 $cm^2/Vs$ or higher. A high quality switching device used in a display device can be obtained from single-crystal Si having high mobility.

There are certain limitations in fabricating single-crystal Si, such as a limitation of processing temperature. When the single-crystal Si is fabricated, the processing temperature cannot rise over a certain temperature that can be endured by a material forming a substrate of the Si.

A method of fabricating a silicon-on-insulator (SOI) wafer using a so-called proprietary Smart-Cut technique includes an annealing process, the processing temperature of which rises up to 1000° C. The above method includes the operations of heat treating of a bare wafer having a predetermined thickness to form an oxide layer thereon, forming a boundary layer using hydrogen impurities by injecting hydrogen ($H^+$) ions under the surface of the wafer, bonding the wafer to a separate substrate and separating the boundary layer to retain silicon of a predetermined thickness on the substrate, and annealing the silicon left on the substrate at the high temperature.

The temperature may rise over 900° C. in the thermal oxidation process, and over 1,100° C. in the annealing process. The high-temperature processes may degrade the characteristics of the substrate. Therefore, the material that can be selected to form the substrate is limited by the high temperature process, and the selected material undergoes thermal shock. Thus, the performance of the device formed using the silicon may be degraded.

SUMMARY OF THE DISCLOSURE

The present invention may provide a method of fabricating single-crystal silicon in which a substrate does not experience thermal shock, and a method of fabricating a thin film transistor (TFT) using this method.

The present invention also may provide a method of fabricating single-crystal silicon on a substrate that is susceptible to heat degradation, and a method of fabricating a TFT using this method.

According to an aspect of the present invention, there is provided a method of fabricating single-crystal silicon including the operations of: growing single-crystal silicon to a predetermined thickness on a crystal growth plate; depositing a buffer layer on the single-crystal silicon layer; forming a partition layer at a predetermined depth in the single-crystal silicon layer by implanting hydrogen ions in the single-crystal silicon layer from an upper portion of an insulating layer; attaching a substrate to the buffer layer; and cutting the partition layer of the single-crystal silicon layer by heating the partition layer from the crystal growth plate to obtain a single-crystal silicon layer of a predetermined thickness on the substrate.

According to another aspect of the present invention, there is provided a method of fabricating a single-crystal silicon thin film transistor (TFT) including the operations of: growing a single-crystal silicon to a predetermined thickness on a crystal growth plate; depositing a buffer layer on the single-crystal silicon layer; forming a partition layer at a predetermined depth in the single-crystal silicon layer by implanting hydrogen ions in the single-crystal silicon layer from an upper portion of an insulating layer; attaching a substrate onto the buffer layer; cutting the partition layer of the single-crystal silicon layer by heating the partition layer from the crystal growth plate to obtain a single-crystal silicon layer of a predetermined thickness on the substrate; and fabricating a single-crystal silicon TFT on the substrate using the single-crystal silicon layer formed on the substrate.

The crystal growth plate may be an alumina ($Al_2O_3$) substrate, and the substrate may be a glass substrate or a plastic substrate.

BRIEF DESCRIPTION OF THE DRAWINGS

The above and other features and advantages of the present invention will be further described in detailed exemplary embodiments thereof with reference to the attached drawings in which.

DETAILED DESCRIPTION OF EXEMPLARY EMBODIMENTS

Hereinafter, preferred embodiments of a method of fabricating a single-crystal silicon (Si) film according to the present invention will be described with reference to the accompanying drawings.

Figure 1A:
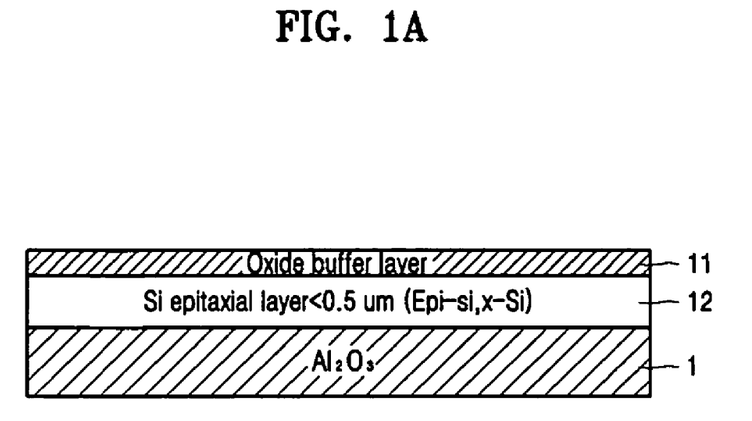
FIGS. 1A through 1G are processing views of a method of fabricating a single-crystal silicon film according to the present invention.

Referring to FIG. 1A, a Si epitaxial layer, that is, a single-crystal silicon film 12 and an oxide layer, for example, a buffer layer 11 are sequentially formed on an $Al_2O_3$ substrate 1 for crystal growth, using a crystal growth method. It is desirable that a thickness of the single-crystal Si film 12 is approximately 0.5 μm or less.

Figure 1B:
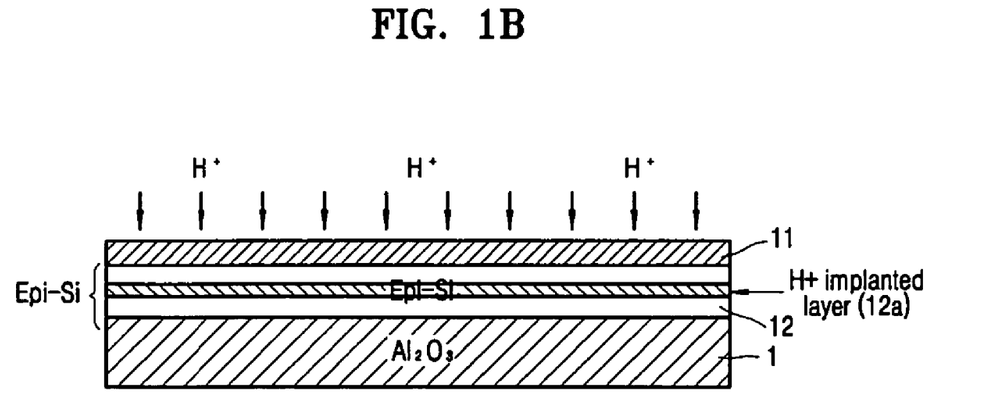

Referring to FIG. 1B, hydrogen ions (H+) are injected to form an implanted layer at an intermediate portion of the single-crystal Si film 12 as a partition layer 12a.

Figure 1C:
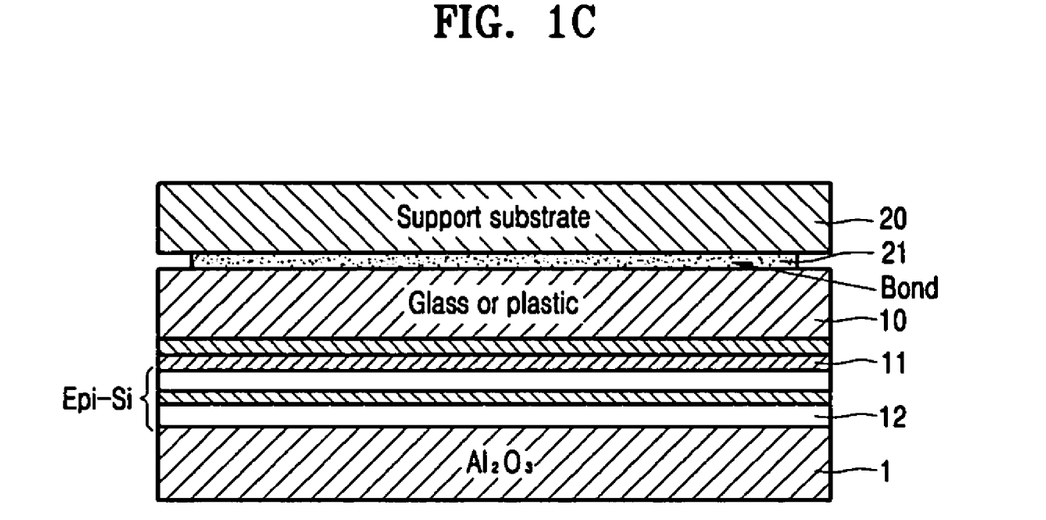

Referring to FIG. 1C, a glass or plastic substrate 10 attached to a supporter 20 by a bond layer 21 is bonded to the Si film 12. To do this, the buffer layer 11 and the Si film 12 under the buffer layer 11 are activated by oxygen plasma, and the substrate 10 is attached to the Si film 12 in an air atmosphere at room temperature.

Figure 1D:
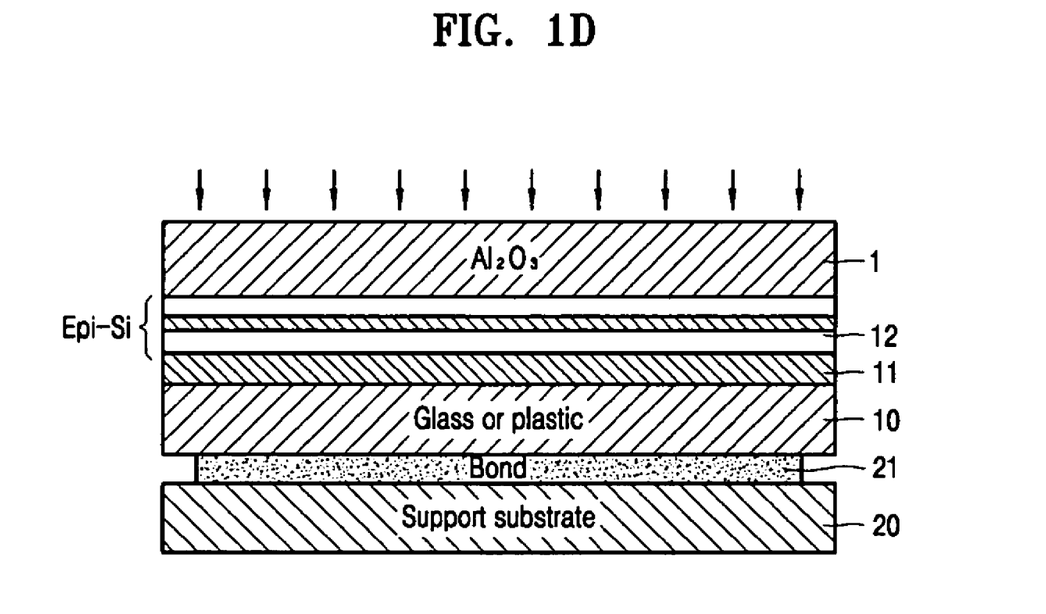

Referring to FIG. 1D, thermal energy, for example, excimer laser of 308 nm, is applied evenly onto the crystal growth plate 1. The implanted layer, that is, the partition layer 12a, which experiences strain due to the impurities, is separated by the thermal energy, and then, the Si film 12 is separated into a Si film 12' at the $Al_2O_3$ substrate 1 side and a Si film 12 at the glass or plastic substrate 10 side, as shown in FIG. 1F. In another method to separate the partition layer 12a, the partition layer 12a is heated at a temperature of approximately 500° C.

Figure 1E:
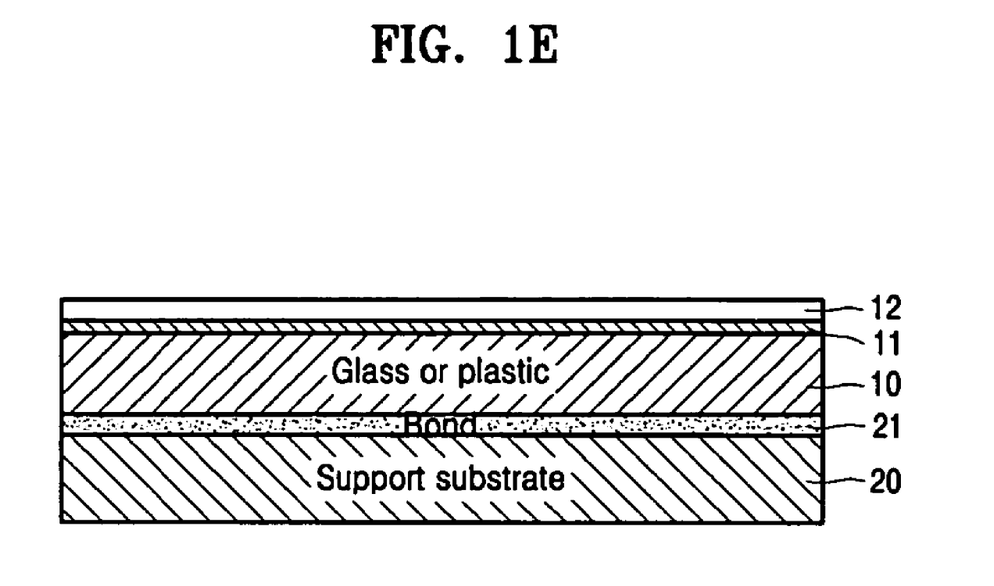
Figure 1F:
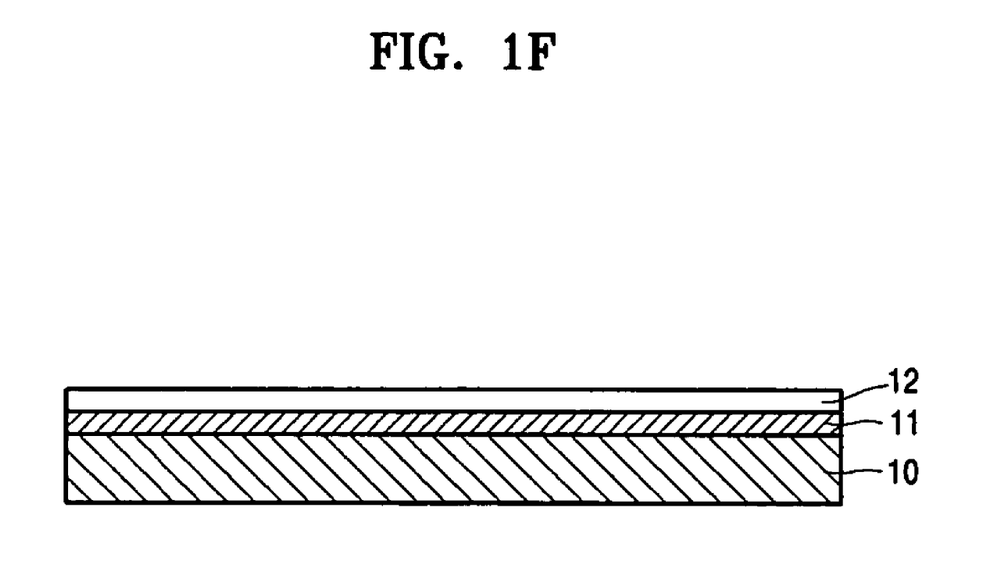
Figure 1G:
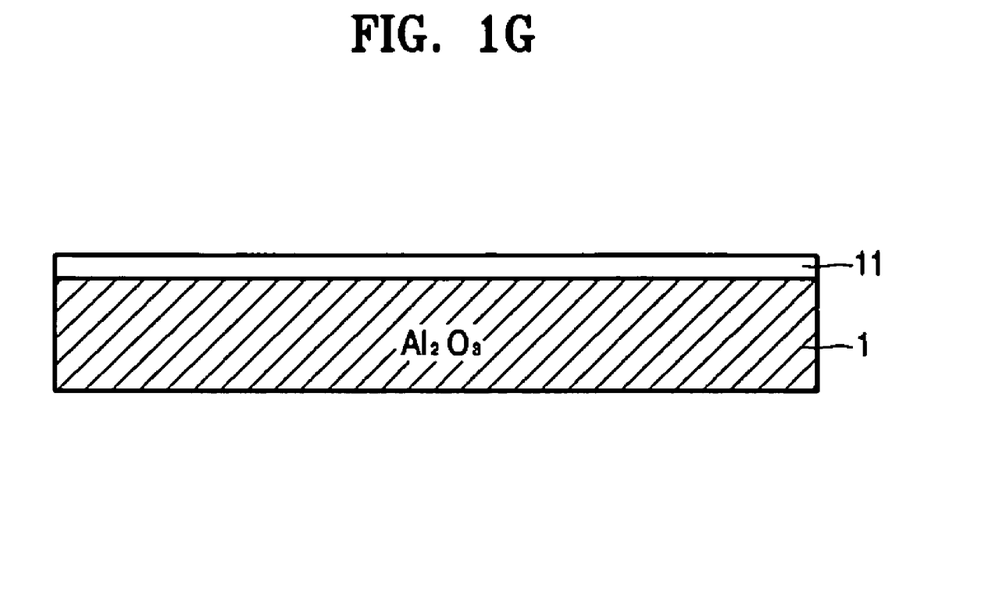
Figure 1H:
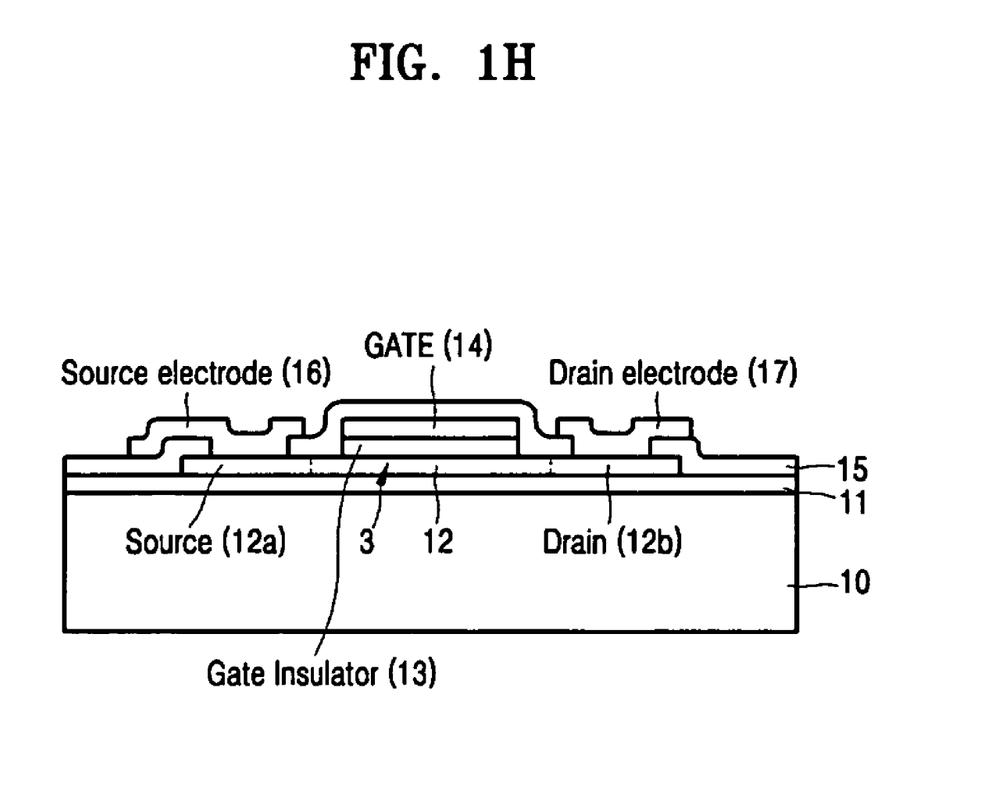
FIG. 1H is a view of an example of a thin film transistor (TFT) using the single-crystal silicon film according to the present invention.

Referring to FIG. 1E, the supporter 20 is separated from the bottom surface of the substrate 10, and after that, the TFT of FIG. 1H is fabricated using a general TFT fabrication method. The single-crystal Si on the substrate 10 is polished to have a predetermined thickness and an even surface by a polishing device before performing the TFT fabrication processes.

In the fabricated TFT, an active layer 12 including a source 12a and a drain 12b at both sides thereof is formed on the plastic or the glass substrate 10 from the single-crystal Si film in the above crystal growth and separation processes, and insulating layers 13 and 15 are formed on the active layer 12. The insulating layer formed on the center upper portion of the active layer 12 is a gate insulating layer 13 that electrically insulates a gate 14 formed on the gate insulating layer 13 from the active layer 12. Portions covering both sides of the active layer 12 and the gate 14 are also insulating layers.

In addition, the separated $Al_2O_3$ substrate 1 in the above process is reintroduced into the processes for growing a new single-crystal Si film. Before being input into the processes, the remaining single-crystal silicon film layer on the $Al_2O_3$ substrate 1 is polished.

Hereinafter, a method of forming the TFT using the Si film formed on the substrate will be described in greater detail.

Figure 2A:
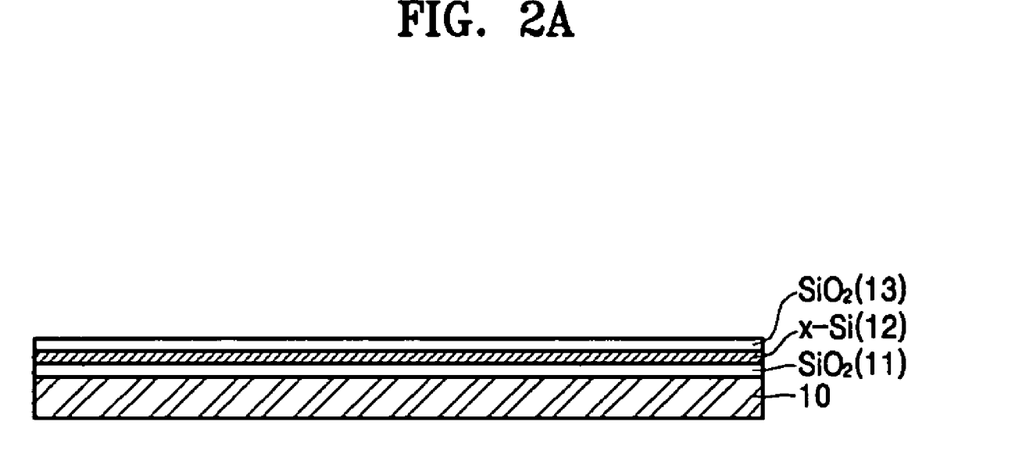
FIGS. 2A through 2H are processing views of a method of fabricating the single-crystal silicon TFT according to the present invention.

Referring to FIG. 2A, in order to fabricate the TFT using the single-crystal Si film obtained through the above-described processes as the active layer, the gate insulating layer 13 is formed on the Si film 12 to a thickness of approximately 1000 Å using an inductively coupled plasma chemical vapor deposition (ICP-CVD) method, a plasma enhanced chemical vapor deposition (PE-CVD) method, or a sputtering method.

If the substrate of the TFT is formed of plastic, the temperature of the heat treatment of a $SiO_2$ thin film should be controlled so as to prevent the substrate from being damaged.

Figure 2B:
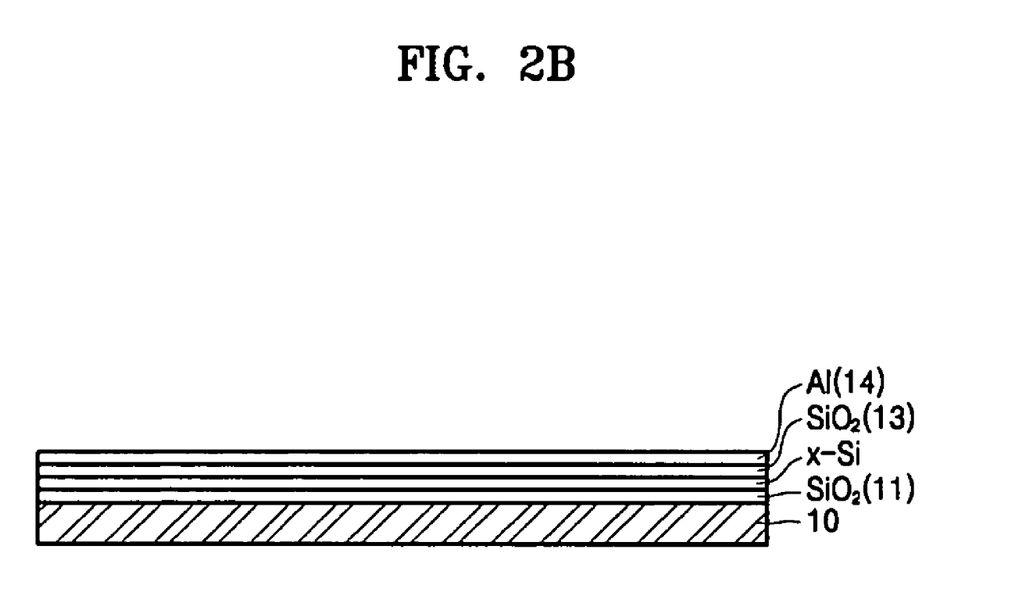

Referring to FIG. 2B, the gate 14 is formed on the gate insulating layer 13. The gate insulating layer 13 and the gate 14 are patterned into a desired shape through following processes that are described hereafter.

Figure 2C:
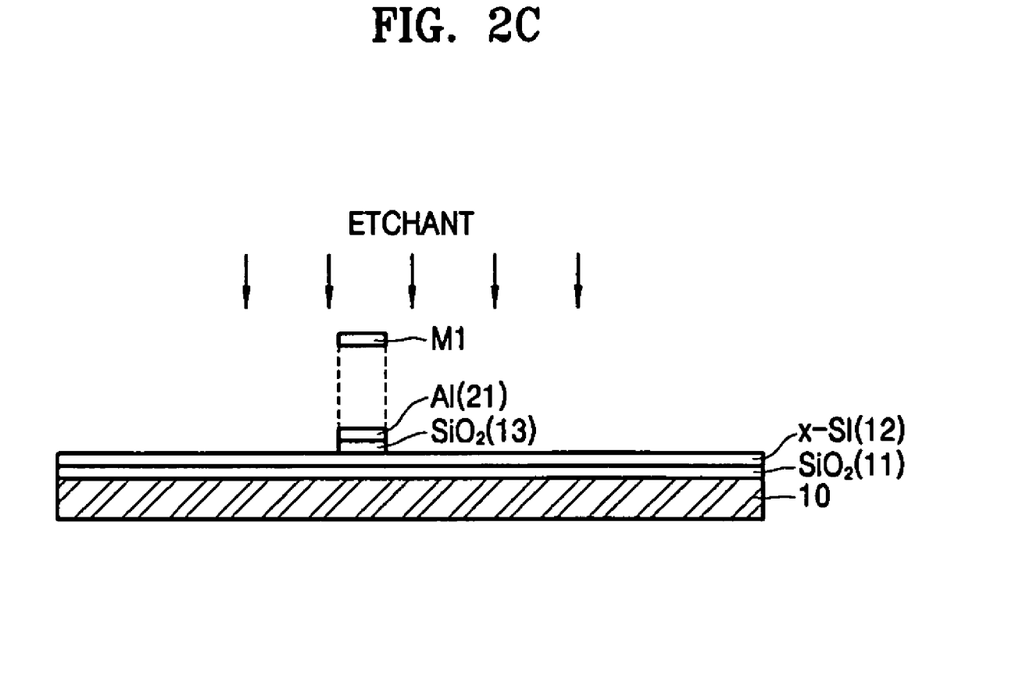

Referring to FIG. 2C, the gate 14 and the gate insulating layer 13 are etched in a dry etching method using a first mask (M1). The mask has a pattern corresponding to the gate 14. The gate 14 is patterned by the pattern of the mask and the gate insulating layer 13 is also patterned to be the same shape. Therefore, the Si film 12 is exposed through the portion that is not covered by the gate 14.

Figure 2D:
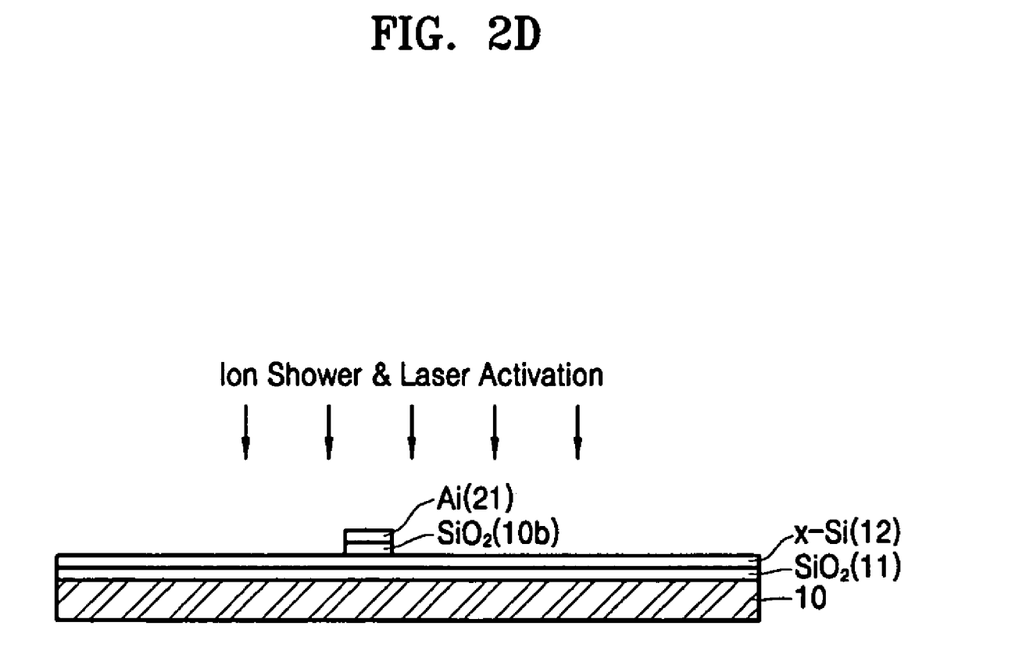

Referring to FIG. 2D, the portion of the Si film 12 that is not covered by the gate 21 is doped using an ion shower, and then, is activated by an XeCl excimer laser of 308 nm.

Figure 2E:
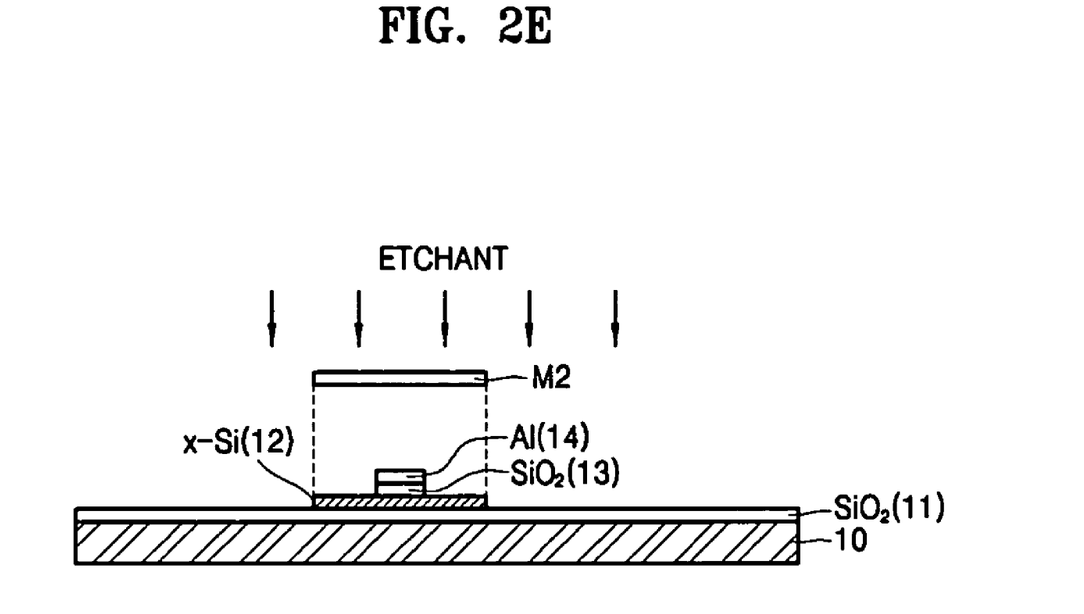

Referring to FIG. 2E, the single-crystal Si film 12 that is not covered by the gate 14 is patterned using a second mask (M2) in a dry etching method and then is doped to form a source 12a and a drain 12b. The single-crystal Si that is not doped remains under the gate 21, and performs as a channel.

Figure 2F:
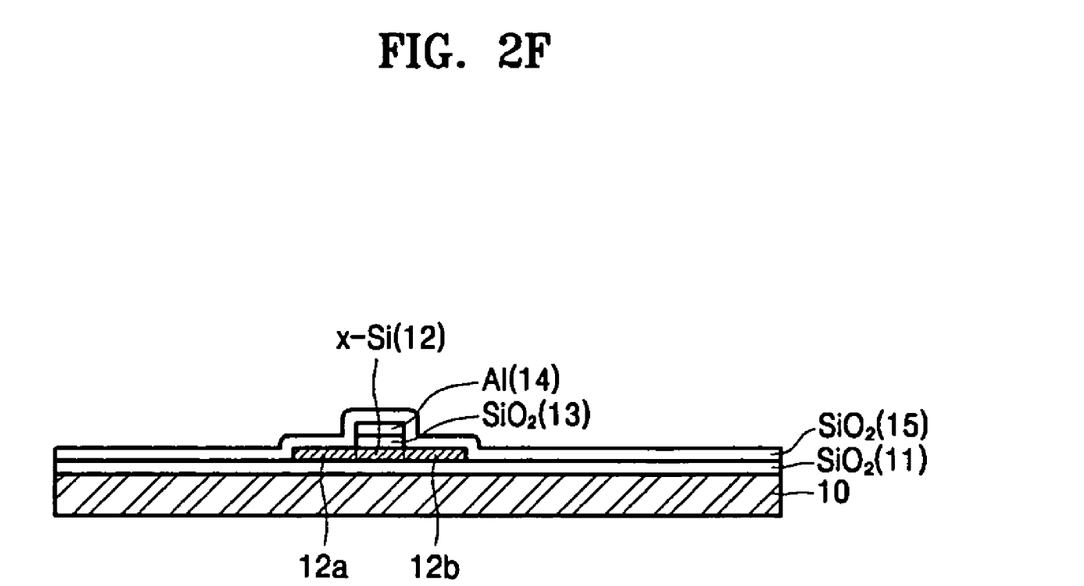

Referring to FIG. 2F, a third $SiO_2$ layer 15 is formed on the above stacked layers to a thickness of approximately 3000 Å as an interlayer dielectric (ILD) using ICP-CVD, PE-CVD, or a sputtering method.

Figure 2G:
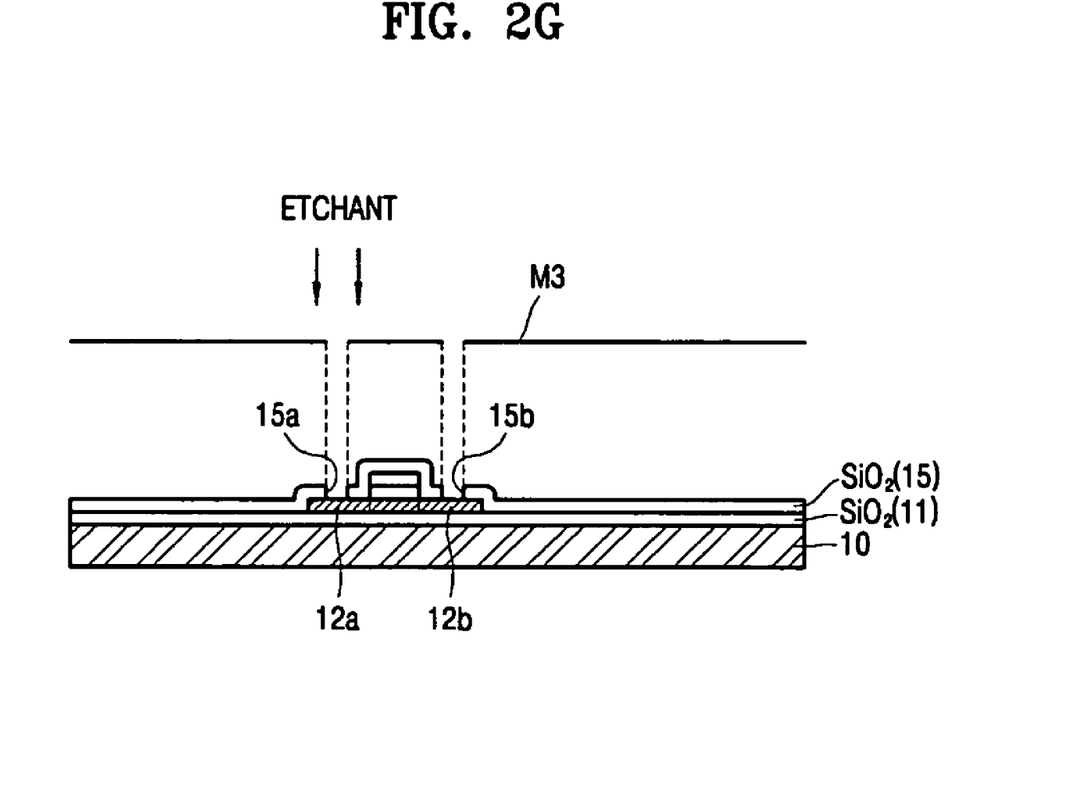

Referring to FIG. 2G, a source contact hole 15a and a gate contact hole 15b are formed on the third $SiO_2$ layer 15 using a third mask (M3).

Figure 2H:
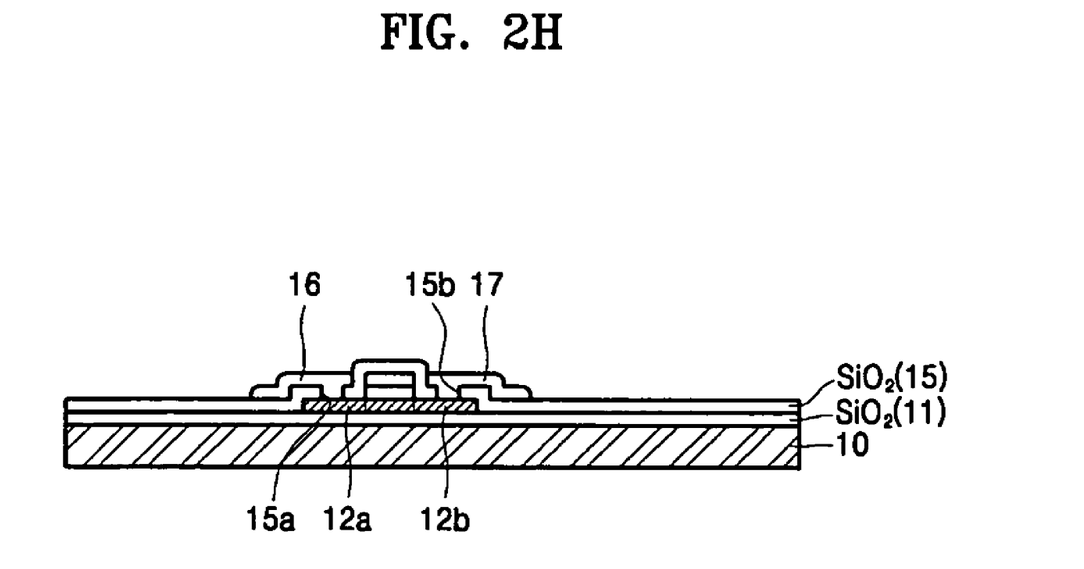

Referring to FIG. 2H, a source electrode 16 and a drain electrode 17 are formed in the source contact hole 15a and the gate contact hole 15b to complete the TFT.

The above described method of fabricating a TFT is an example of a method of fabricating a TFT using a single-crystal Si film fabricated according to the present invention. However, this method can be modified in various ways.

According to the present invention, the single-crystal Si film can be readily obtained. Instead of the plastic or glass substrate that is susceptible to heat damage in the heat treatment process, the crystal growth plate is used to obtain a high quality single-crystal Si film. In addition, the partition layer can be formed in the single-crystal Si film formed on the crystal growth plate in the ion implantation process, and thus, a desired very thin Si film, the thickness of which is approximately 100 nm or thinner, can be obtained.

Therefore, according to the present invention, since the Si layer is formed on the plastic substrate or the glass substrate, a system on glass (SOG) or a system on plastic (SOP) structure using the single-crystal Si can be formed. Thus, according to the present invention, a high performance TFT having high reproducibility and less performance variation between the elements can be fabricated. In addition, the single-crystal Si is grown using the $Al_2O_3$ substrate having a high thermal endurance, and then, moved onto the plastic or glass substrate, and thus, the $Al_2O_3$ substrate can be repeatedly used to grow new single-crystal Si.

The method of fabricating the single-crystal Si can be applied to a solar battery using silicon, as well as to TFTs.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating single-crystal silicon comprising the operations of:
    growing single-crystal silicon to a predetermined thickness on a crystal growth plate;
    depositing a buffer layer on the single-crystal silicon layer;
    forming a partition layer at a predetermined depth in the single-crystal silicon layer by implanting hydrogen ions in the single-crystal silicon layer from an upper portion of an insulating layer;
    attaching a substrate to the buffer layer; and
    cutting the partition layer of the single-crystal silicon layer by heating the partition layer from the crystal growth plate to obtain a single-crystal silicon layer of a predetermined thickness on the substrate.

2. The method of claim 1, further comprising the operation of attaching the substrate onto a plate supporter before heating the partition layer of the single-crystal silicon layer.

3. The method of claim 1, wherein the crystal growth plate is an alumina ($Al_2O_3$) substrate.

4. The method of claim 1, wherein the substrate is a glass substrate or a plastic substrate.

5. The method of claim 1, wherein the single-crystal silicon layer is formed to have a thickness of approximately 0.5 μm or less.

6. A method of fabricating a single-crystal silicon thin film transistor (TFT) comprising the operations of:

growing a single-crystal silicon to a predetermined thickness on a crystal growth plate;

depositing a buffer layer on the single-crystal silicon layer;

forming a partition layer at a predetermined depth in the single-crystal silicon layer by implanting hydrogen ions in the single-crystal silicon layer from an upper portion of an insulating layer;

attaching a substrate onto the buffer layer;

cutting the partition layer of the single-crystal silicon layer by heating the partition layer from the crystal growth plate to obtain a single-crystal silicon layer of a predetermined thickness on the substrate; and fabricating a single-crystal silicon TFT on the substrate using the single-crystal silicon layer formed on the substrate.

7. The method of claim 6, further comprising the operation of polishing the single-crystal silicon layer on the substrate before fabricating the TFT.

8. The method of claim 6, further comprising the operation of attaching the substrate onto a plate supporter before cutting the partition layer.

* * * * *